United States Patent
Maesaka

(10) Patent No.: US 7,193,287 B2
(45) Date of Patent: Mar. 20, 2007

(54) MAGNETIC MEMORY DEVICE, A METHOD FOR MANUFACTURING A MAGNETIC MEMORY DEVICE, AND AN INTEGRATED CIRCUIT DEVICE INCLUDING SUCH MAGNETIC MEMORY DEVICE

(75) Inventor: Akihiro Maesaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/764,061

(22) Filed: Jan. 23, 2004

(65) Prior Publication Data

US 2004/0233757 A1   Nov. 25, 2004

(30) Foreign Application Priority Data

Jan. 24, 2003  (JP) .......................... P2003-015927

(51) Int. Cl.
*H01L 29/82* (2006.01)
(52) U.S. Cl. .................. 257/422; 257/421; 257/295; 257/296
(58) Field of Classification Search ................ 257/421, 257/422, 295, 296; 360/324.2
See application file for complete search history.

(56) References Cited

U.S. PATENT DOCUMENTS

| | | | | |
|---|---|---|---|---|
| 6,210,818 B1 * | 4/2001 | Saito | ................ | 428/811.2 |
| 6,801,414 B2 * | 10/2004 | Amano et al. | ............ | 360/324.2 |
| 6,819,532 B2 * | 11/2004 | Kamijo | ................ | 360/324.11 |
| 6,879,475 B2 * | 4/2005 | Kishi et al. | ............... | 360/324.2 |

* cited by examiner

*Primary Examiner*—Doug Menz
(74) *Attorney, Agent, or Firm*—Sonnenschein Nath & Rosenthal LLP

(57) ABSTRACT

This invention proposes a stable magnetic memory device that is equipped with a storage cell having a MTJ, wherein variation in the coercive force (Hc) of a ferromagnetic free layer is suppressed, and a switching characteristic of a bit of a MRAM is improved, and there is no write error. Namely in a magnetic memory device equipped with a first wiring, a second wiring (bit line) intersecting with the first wiring, and a storage cell for writing/reading information of a magnetic spin at an intersecting area of the first wiring and the second wiring, a partial sidewall portion electrically connecting to the storage cell of the second wiring (bit line) has a forward tapered form having a contact angle relative to a top surface of the storage cell being 45 degrees or more.

12 Claims, 7 Drawing Sheets

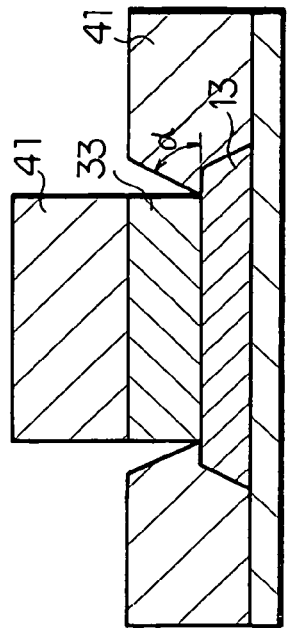
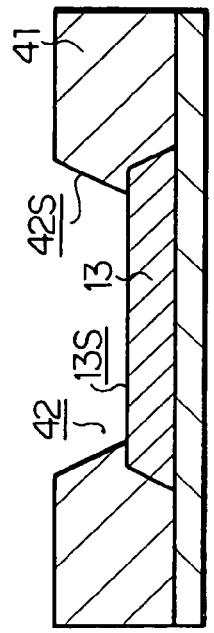
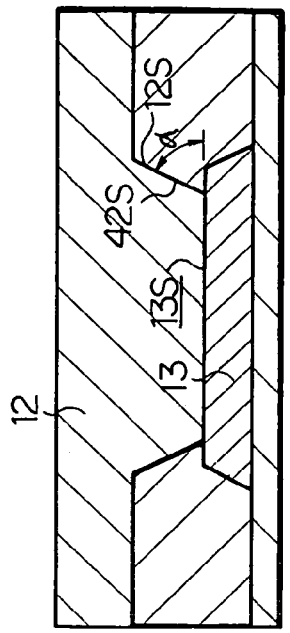
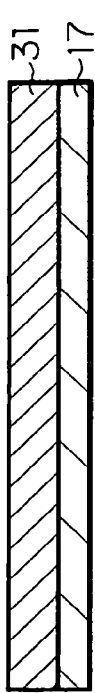
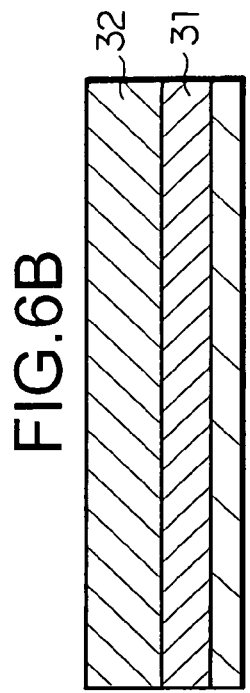
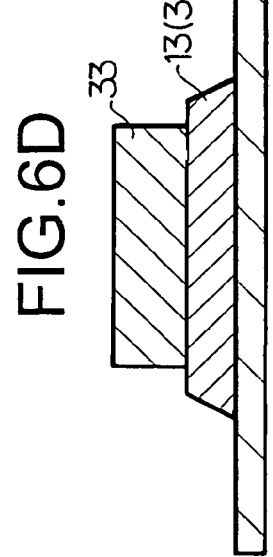

MAGNETIC MEMORY DEVICE, A METHOD FOR MANUFACTURING A MAGNETIC MEMORY DEVICE, AND AN INTEGRATED CIRCUIT DEVICE INCLUDING SUCH MAGNETIC MEMORY DEVICE

CROSS REFERENCE TO RELATED APPLICATION

This application claims priority from Japanese Priority Document No. 2003-015927, filed on Jan. 24, 2003 with the Japanese Patent Office, which document is hereby incorporated by reference.

BACKGROUND OF THE INVENTION

1. Field of the Invention

This invention relates to a magnetic memory device, a method for manufacturing such magnetic memory device, and an integrated circuit device using a plurality of such magnetic memory devices, and particularly to a magnetic memory device, a method for manufacturing such magnetic memory device, and an integrated circuit device using such magnetic memory devices, wherein the magnetic memory device is a nonvolatile magnetic memory device that memorizes information utilizing the change of resistance value depending on that the spin direction of a ferromagnetic material is parallel or anti-parallel.

2. Description of Related Art

Along with an extreme wide-spread of communication apparatuses and, in particular, personal digital assistants such as mobile terminals, higher performances such as high-integration, high-speed, low power consumption and the like are required to memory devices and logic devices that constitute these apparatuses. Particularly, the nonvolatile memory is thought to be an indispensable device in this ubiquitous age. In such a case of power shortage, trouble in power supply, or shutdown of a link between a server and a network by failure or something, the nonvolatile memory is able to protect important personal information. And those technologies relating to high density and large capacity have become important as a technology for replacing a hard disk and an optical disk which are basically impossible for miniaturization of apparatuses due to the existence of the movable parts.

Further, a recent mobile apparatus is designed to save power consumption as much as possible by employing a standby mode to an unnecessary circuit block, and accordingly, if a nonvolatile memory capable of combining a high-speed network memory and a large capacity storage memory is realized, it is possible to save power consumption and to delete unnecessary memory. Further, if such high speed and large capacity nonvolatile memory is realized, it becomes possible to carry out a so-called instant-on function which functions to start up immediately after the power is on.

As an nonvolatile memory, a flash memory using a semiconductor, a FRAM (Ferroelectric Random Access Memory) using a ferroelectric material and the like are now on the market, and active research and development for higher performances have been conducted. Recently, a magnetic memory called a MRAM (Magnetic Random Access Memory) or a MR (Magneto Resistance) memory utilizing a tunnel magneto-resistance effect has been manufactured by way of trial, and has gathered the attention as a new type of a nonvolatile memory employing a magnetic material. For example, please refer to a non-patent publication 1 (Peter K. Naji, Mark Durlam, Saied Tehrani, John Calder, Mark F. DeHerrera, "A 256 kb 3.0V 1T1MTJ Nonvolatile Magnetoresistive RAM", 2001 IEEE International Solid-State Circuits Conference Digest of Technical Papers, (2001) p. 122–123). The MRAM is better than a flash memory in a random access operation, the number of rewritable operation, and a high speed operation, and is also better than FeRAM in the number of rewritable operation. In addition, both a high integration like DRAM and a high speed like SRAM are expected, so that the MRAM has a possibility of being replaced instead of an embedded memory for a system LDD.

The MRAM has a structure in which minute magnetic devices for recording information are regularly arranged, and a wiring operation is provided for accessing each of them. A general MRAM (Magnetic Random Access Memory) is now explained with reference to a conceptual perspective view which shows a main part in FIG. 7 with simplification. In FIG. 7, a portion of a read out circuit is omitted for simplification.

As shown in FIG. 7, a gate electrode (read word line) 26 is formed on a semiconductor substrate (p type semiconductor substrate, for example) 21 by way of a gate insulating film (not shown), and on the semiconductor substrate 21 of both sides of the gate electrode 26, diffusion layer areas ($N^+$ diffusion layer area, for example) 27 and 28 are formed so as to configure a selecting field effect transistor 24. The above mentioned field effect transistor 24 functions as a switching element for read out operation. It is possible to use various switching elements such as diodes, bipolar transistors and the like in addition to n type or p type field effect transistors, in stead.

In the diffusion layer area 27 of the above mentioned field effect transistor 24, a contact (tungsten plug, for example, although not shown) is formed, and further, a sense line (not shown) to be connected to this contact is formed. In addition, in the diffusion layer area 28 of the above mentioned field effect transistor 24, a contact (tungsten plug, for example) 30 is formed.

One end of the lower electrode (bypass line) 17 is connected to the above mentioned contact 30, and the other end of the lower electrode 17 is connected to a storage cell (TMR device, for example) 13 having a magnetic tunnel junction (hereinafter referred to as MTJ). In addition, below the storage cell 13, a write word line 11 is formed by way of the lower electrode 17, and an insulating film (not shown). The above mentioned lower electrode 17 is made of a conductive material, and may be formed with a stacked structure of a conductive layer and an antiferromagnetic layer, or formed in a condition where a magnetic fixed layer is extensively formed.

The above mentioned storage cell 13 is formed on the above mentioned antiferromagnetic layer (not shown), and also above the above mentioned write word line 11, and is so configured as to sandwich a non-magnetic spacer layer (tunnel insulating layer) 303 between a ferromagnetic fixed layer 302 and a ferromagnetic free layer (storage layer) 304 in which a magnetization is easily rotatable. Further, a protecting layer (not shown) is formed on the storage cell 13.

In addition, a bit line 12 is formed to be connected to on a top surface of the above mentioned storage cell 13 and to be three-dimensionally intersecting (at right angle, for example) with the above mentioned write word line 11 while sandwiching the above mentioned storage cell 13.

In the magnetic memory device thus configured as above, the writing operation is carried out by controlling the direction of magnetization of the storage cell 13 based on a synthetic magnetic field caused by current flowing through both the write word line 11 and the bit line 12. In the reading out operation, a cell selection is carried out by the field effect transistor 24, and the difference in the direction of magnetization is detected as a difference in a voltage signal based on the magnetoresistance effect of the storage cell 13. In this case, various transistors such as field effect transistors and diodes are able to be used as selecting devices for reading out operation.

Next, a MRAM cell array in which magnetic memory devices described in FIG. 7 are arranged with a certain regularity is described with reference to a conceptual circuit diagram shown in FIG. 8.

As shown in FIG. 8, the magnetic memory devices each having a configuration as described with reference to FIG. 7 are connected in a matrix form by a read word line 26, a write word line 11, and a bit line 12. Namely, in the storage cell 13 of each of the magnetic memory devices, the fixed layer side of the storage cell 13 is connected to one of diffusion layers of the field effect transistor 24 and the free layer side thereof is connected to the bit line 12. In addition, the other of the diffusion layers of the field effect transistor 24 is connected to ground, and the gate electrode of the field effect transistor 24 is connected to the read word line 26. Further, the write word line 11 is three dimensionally intersected (at right angle) with the bit line 12, and is provided beneath the fixed layer side of the storage cell 13.

In the MRAM as described above, its writing operation is carried out by controlling the direction of magnetization of the targeted storage cell 13 where the write word line 11 and the bit line 12 intersects to each other with a synthesized magnetic field caused by flowing current through both the write word line 11 and the bit line 12. A transistor is used for reading out operation of the stored information in the memory cell. That is, it is able to read out stored information of the targeted cell where the write word line 11 and the bit line 12 intersects to each other by setting the read word line 26 where the targeted cell is connected to be a high (on) level, and by detecting a voltage change of the bit line 12. In this case, a potential of the bit line 12 designates a value proportional to a magnetoresistance ($\Delta R$) determined by the direction of magnetization of the storage cell 13.

In the cell having MTJ, the direction of magnetization of the ferromagnetic fixed layer is fixed by an antiferromagnetic layer. The writing operation is carried out by rotating the direction of magnetization of the ferromagnetic free layer with current magnetic field generated by a word line and a bit line. In the cell having MTJ, its magnetoresistance changes depending on an angle of magnetization by a ferromagnetic free layer and a ferromagnetic fixed layer. A value of the magnetoresistance becomes a maximum value when two directions of the magnetization of the ferromagnetic fixed layer and the ferromagnetic free layer are antiparallel, and becomes a minimum value when these directions of the magnetization are parallel. In general, the distinction of the magnetizing condition as above is stored with reference to the information of [0] and the information of [1]. In case of the reading out operation, this distinction of the magnetoresistance value is detected as a distinction of a voltage signal.

In order to stably drive the MRAM depicted in FIG. 8, it is important to suppress variation in a switching magnetic field at each cell. This switching magnetic field depends on the coercive force (Hc) of the ferromagnetic free layer and the interlayer coupling magnetic field (Hf) acting between the ferromagnetic fixed layer and the ferromagnetic free layer. Regarding a method for reducing the variation of the interlayer coupling magnetic field (Hf) is already described in an patent application. For example, please refer to a Japanese patent application 2002-091259 (laid-opened as OP2002-091259). This laid-opened patent describes that a MTJ cell having better flatness is obtained by defining an average grain diameter (30 nm or less) of a crystal grain and a crystalline orientation (no orientation) of either antiferromagnetic layer or ferromagnetic fixed layer within the cell having MTJ, and as a result, it is possible to suppress the interlayer coupling magnetic field (Hf) between the ferromagnetic fixed layer and the ferromagnetic free layer to be small, and further, to suppress a distribution of the variation in the interlayer coupling magnetic field (Hf) at each cell. On the other hand, regarding the variation factor in the coercive force (Hc), it is pointed out a possibility of depending generally on a shape of the cell having MTJ. For example, please refer to a non-patent publication 2 (Ricardo C. Sousa and Paulo P. Freitas, "Dynamic Switching of Tunnel Junction MRAM Cell with Nanosecond Field Pulses", IEEE Transactions, (2000) Vol.36, No.5, p. 2770–2772. However, in case of fabricating an actual MRAM device, even though shapes of the cells having MTJs are arranged to be almost the same, variation in the coercive force (Hc) is still observed, and accordingly, it is suggested that there is a possibility of another factor.

Conventionally, in a MTJ cell having an antiferromagnetic layer, a ferromagnetic fixed layer, a non-magnetic spacer layer, and a ferromagnetic free layer, the reason for causing the variation in a coercive force (Hc) of the ferromagnetic free layer has not been fully cleared.

SUMMARY OF THE INVENTION

The inventor of the present invention discovered that a contact angle $\alpha$ of an upper electrode (bit line) connecting to a cell having a MTJ is an important parameter as a factor for increasing the variation in the coercive force (Hc). Accordingly, this invention provides a table magnetic storage device without any write error by removing the factor that generates such variation in the coercive force (Hc) in order to decrease the variation in the coercive force (Hc), and by improving a switching characteristic of a bit of the MRAM.

Accordingly, the present invention relates to a magnetic memory device, a method for manufacturing such magnetic memory device, and an integrated circuit device including such magnetic memory devices to resolve the above mentioned problems.

The magnetic memory device of the present invention comprises of a first wiring, a second wiring intersecting with the first wiring, and a storage cell for writing/reading information of a magnetic spin at an intersecting area of the first wiring and the second wiring, wherein a partial sidewall portion of the second wiring connecting electrically to the storage cell is formed to be a forward tapered form having a contact angle relative to the upper surface of the storage cell being 45 degrees or more.

In the above mentioned magnetic memory device, the partial sidewall portion of the second wiring connecting electrically to the storage cell is formed to be the forward tapered form having a contact angle relative to the upper surface of the storage cell being 45 degrees or more, so that a distance between the upper surface of the storage cell and the second wiring is secured and the storage cell is preferably hard to receive a disturbance of the external magnetic filed generated from the second wiring, and as a result, a magnetic domain at the upper surface of the storage cell becomes stable.

The method for manufacturing the magnetic memory device of the present invention comprises a step of forming a first wiring, a step of forming a resist pattern on a area where a storage cell made of stacked film is formed after forming, on the first wiring by way of an insulating film, the stacked film for forming the storage cell for writing/reading information of a magnetic spin, a step of forming the storage cell by patterning the stacked film with etching using the resist pattern as a mask, a step of forming an insulating layer while leaving the resist pattern on the storage cell, a step of forming an opening on the storage cell by removing the insulating layer formed on the insulating layer together with the resist pattern, and a step of forming a second wiring electrically connecting to the storage cell through the opening and three dimensionally intersecting with the first wiring while sandwiching the storage cell, wherein the sidewall of the opening is formed to be a forward tapered form having a contact angle relative to the upper surface of the storage cell being 45 degrees or more.

In the method for manufacturing the above mentioned magnetic memory device, the sidewall of the opening is formed to be a forward tapered form having a contact angle relative to the upper surface of the storage cell being 45 degrees or more, and it is so formed that the distance between the upper surface of the storage cell and the second wiring, and the storage cell is preferably hard to receive the disturbance of the external magnetic filed generated from the second wiring. As a result, the magnetic domain at the upper surface of the storage cell is made stable.

The integrated circuit device including the magnetic memory devices according to the present invention includes a plurality of integrated magnetic memory devices each comprising a first wiring, a second wiring three dimensionally intersecting with the first wiring, and a storage cell provided at an intersecting area of the first wiring and the second wiring for writing/reading information of a magnetic spin, wherein a partial sidewall portion of the second wiring electrically connecting to the storage cell is formed to be a forward tapered form having a contact angle relative to the upper surface of the storage cell being 45 degrees or more.

The integrated circuit device including the above mentioned magnetic memory devices is an integrated form of the magnetic memory devices of the present invention, so that the same operation and effect as those of the magnetic memory device according to the present invention are obtained.

BRIEF DESCRIPTION OF THE DRAWINGS

FIGS. 6A to 6G are one embodiment of the method for manufacturing the magnetic memory device of the present invention, and shows sectional views in manufacturing processes for the connecting portion of the second wiring (bit line) and the storage cell;

DETAILED DESCRIPTION OF THE PREFERRED EMBODIMENTS

Figure 7:
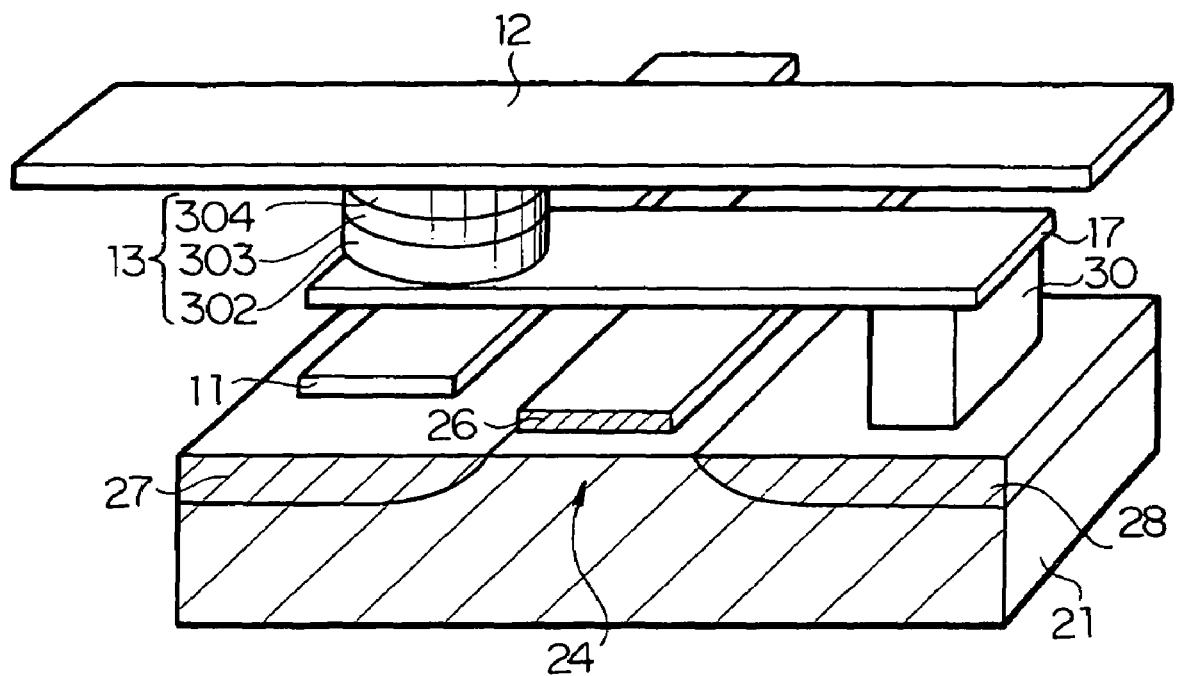
FIG. 7 is a conceptual perspective view of the magnetic memory device.

One embodiment relating to the magnetic memory device of the present invention is described hereinafter. The magnetic memory device of the present invention has a configuration as described in FIG. 7, and is particularly characterized in a connecting portion of a second wiring (bit line) 12 and a storage cell 13. Hereinafter, the characterized connecting portion is described with reference to a conceptual sectional view shown in FIG. 1.

Figure 1:
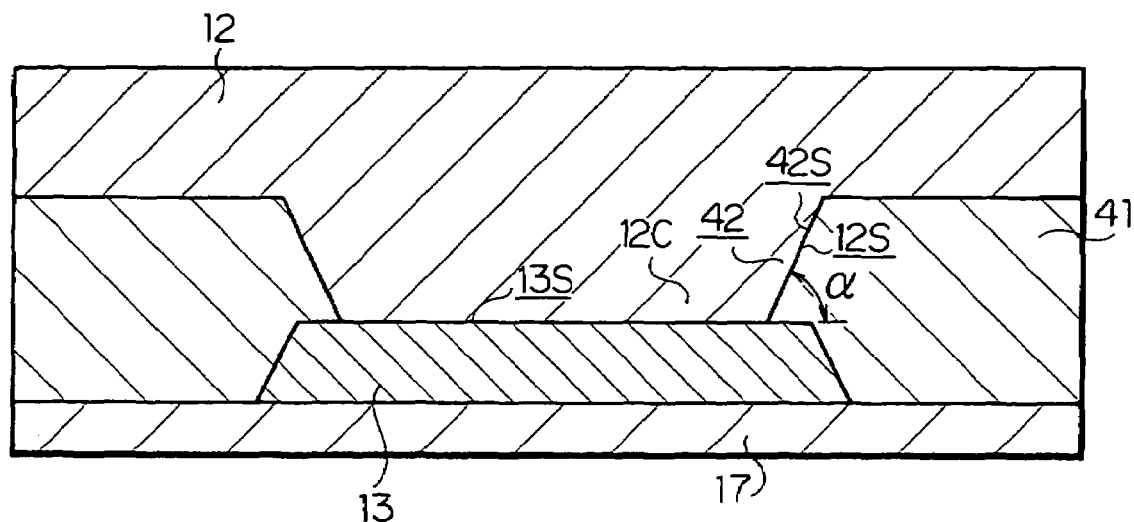
FIG. 1 is one of embodiments of the magnetic memory device of the present invention, and is a conceptual sectional view for showing a portion connecting with a second wiring (bit line) and a storage cell.

As shown in FIG. 1, the storage cell 13 having a MTJ (Magnetic Tunnel Junction) is formed on a lower electrode 17. Generally, a conductive protecting layer is formed on the storage cell 13, although not shown. An insulating film 41 is formed on periphery of the storage cell 13, and further an opening 42 is formed so as to expose a top surface of the storage cell 13. The insulating film 41 is made of aluminum oxide, for example, or may be made of a silicon-based insulating film such as a silicon oxide film. The above mentioned opening 42 is formed so that a sidewall 42S thereof has a forward tapered form having a tilt angle α formed relative to the top surface 13S of the storage cell 13 being 45 degrees or more. Further on the above mentioned insulating film 41, the second wiring (bit line) 12 three-dimensionally intersecting (at right angle, for example) with the first wiring (write word line), though not shown, while sandwiching the above mentioned storage cell 13, is formed so that the second wiring (bit line) 12 is connected to the top portion of the storage cell 13 through the opening 42. Accordingly, the angle formed by the sidewall 12S of the connecting portion 12C where the second wiring (bit line) 12 is connected to the storage cell 13, and the top surface 13S of the storage cell 13 becomes α (hereinafter referred to as a contact angle) so as to form a forward tapered form having the contact angle of 45 degrees or more. In this description of the embodiment, the tilt angle of the sidewall 42S of the opening 42 and the contact angle of the sidewall 12S at the connecting portion 12C of the second wiring 12 become the same, so that the same sine α is applied here.

Then, the effect wherein the contact angle α of the upper electrode affects to the variation in the coercive force (Hc) of the free layer made of ferromagnetic material of the storage cell 13 having MTJ is described.

Figure 2:
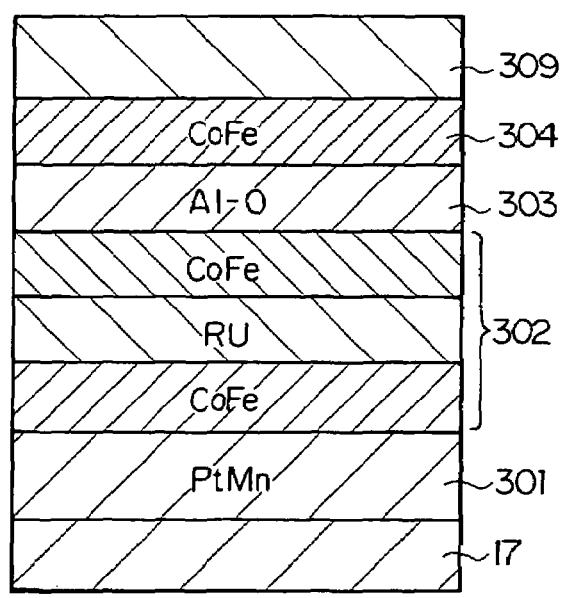
FIG. 2 is a conceptual sectional view showing one of configuration examples of the storage cell.

The configuration of the storage cell 13 comprises of an antiferromagnetic layer 301, a ferromagnetic fixed layer 302, a non-magnetic spacer layer 303, a ferromagnetic free layer 304, and a protecting layer 309 on the lower electrode 17 as shown in FIG. 2, and specifically, the antiferromagnetic layer 301 is made of platinum manganese (PtMn), and the ferromagnetic fixed layer 302 has a three-layered structure having a ferromagnetic layer made of ferrocobalt (CoFe), a conduction layer made of ruthenium (Ru), and a ferromagnetic layer made of ferrocobalt (CoFe). In addition, a non-magnetic spacer layer 303 is made of aluminum oxide, a ferromagnetic free layer 304 is formed with a ferromagnetic layer made of ferrocobalt (CoFe), and a protecting layer 309 is formed with tantalum (Ta). Further, the insulating layer 41 described in FIG. 1 is made of aluminum oxide, and the above mentioned second wiring (bit line) 12 is made of copper.

Further, a correlation of the variation in the coercive force (Hc) of the free layer is evaluated relative to the magnetic memory device fabricated by altering process condition (such as a resist shape and a film-forming condition of the insulating film 41).

Figure 3A:
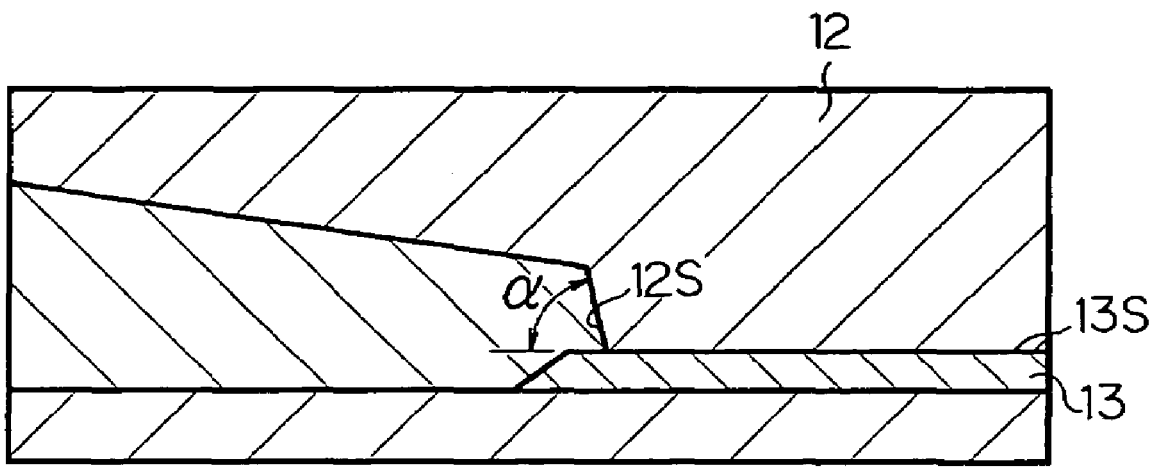
FIGS. 3A and 3B are conceptual sectional views showing one embodiment and one comparative example of the present invention.
Figure 3B:
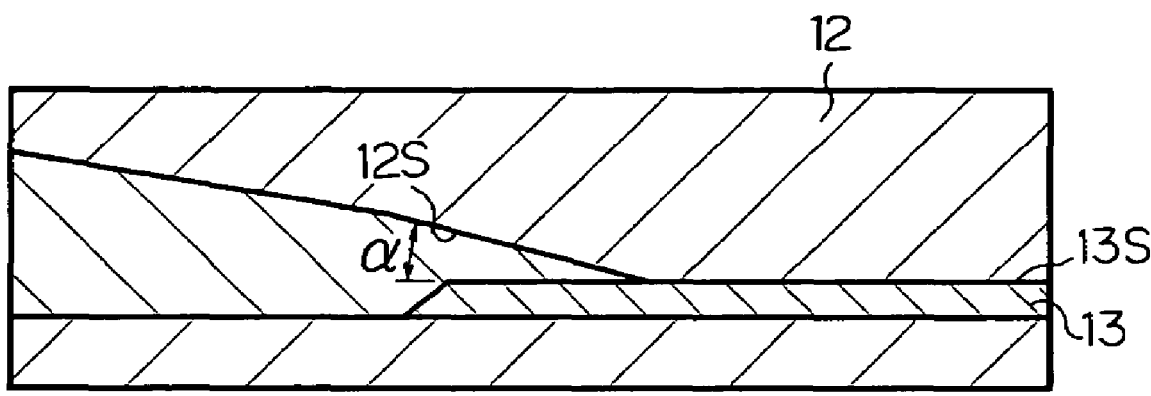

One embodiment of thus fabricated device configuration is described with reference to a conceptual sectional view in FIGS. 3A and 3B. FIG. 3A shows a configuration of the embodiment according to the present invention, and FIG. 3B shows a comparative example. The structural difference between the present embodiment and the comparative example lies on the contact angle α formed by the sidewall 12S at the connecting portion of the second wiring (bit line) 12 and the top surface 13S of the storage cell 13, and the contact angle α of this embodiment is 80 degrees while the contact angle α of the comparative example is 15 degrees.

In order to quantitatively evaluate the variation in the coercive force (Hc) of the free layer, the variation in the coercive force (Hc) of the free layer is defined as below. That is, the coercive force (Hc) is measured at the time when the magnetic field of the ferromagnetic free layer is reversed, and thus obtained distribution is fitted as a normal distribution. A value [σ/(average value of Hc)] obtained by dividing a dispersion σ of the normal distribution with an average value of the coercive force (Hc) is defined as the variation of the coercive force (Hc).

When the variations in the coercive force (Hc) are compared between the embodiment and the comparative example in FIGS. 3A and 3B, the variation in the comparative example in FIG. 3B where the contact angle α formed by the sidewall 12S of the second wiring (bit line) 12 and the top surface 13S of the storage cell 13 becomes 15 degrees relative to the variation in the embodiment in FIG. 3A where the contact angle α formed by the sidewall 12S of the second wiring (bit line) 12 and the top surface 13S of the storage cell 13 becomes 80 degrees is improved by around 4%.

Further by changing the process condition (resist form and the film-forming condition for the insulating film 41), the storage cell 13 having a MTJ of different contact angle α of the second wiring (bit line) 12 is fabricated.

Figure 4:
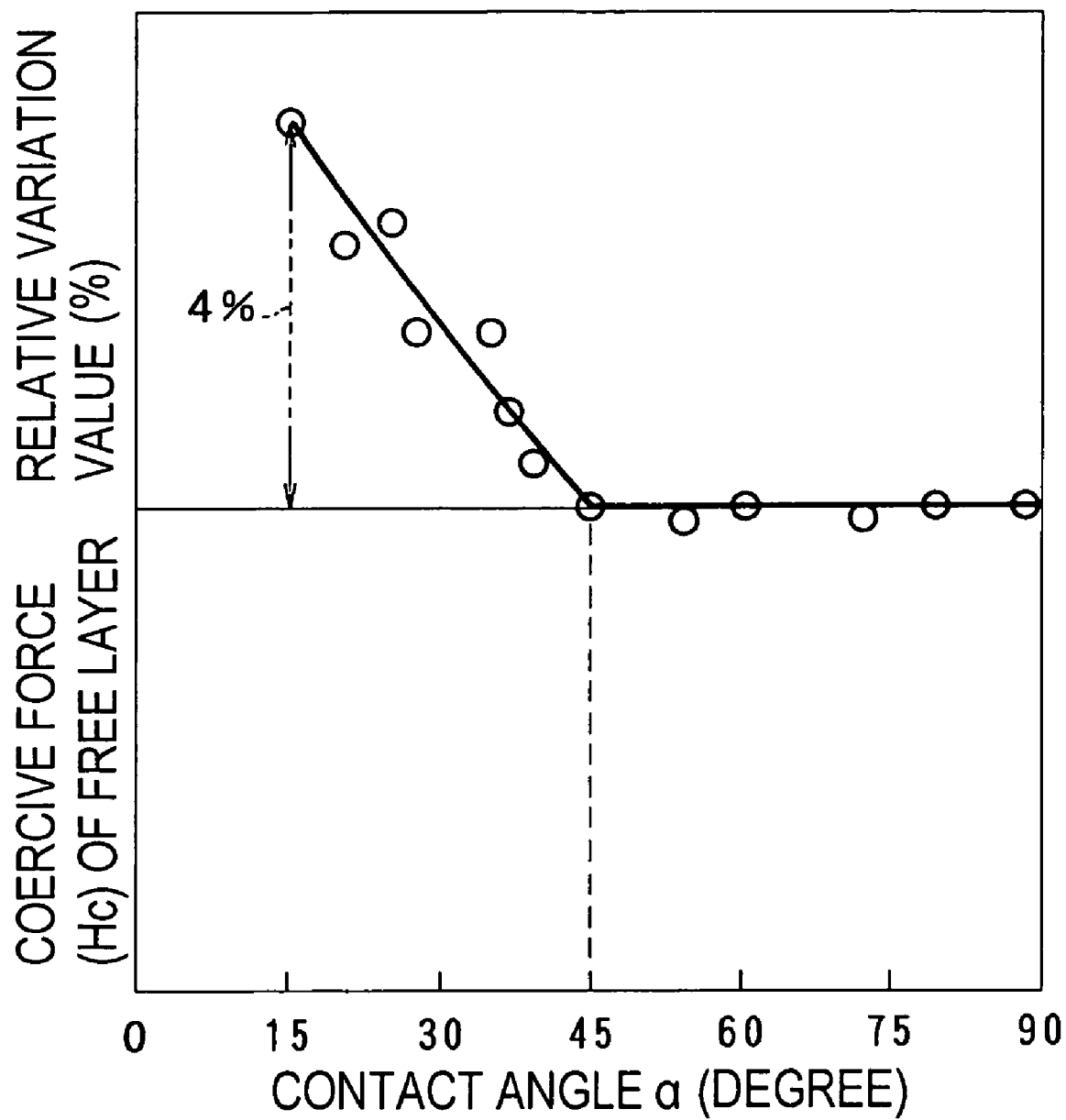
FIG. 4 is a chart designating relation between a coercive force and a contact angle α of the fixed layer.

The correlation between the contact angle α formed by the sidewall 12S of the second wiring (bit line) 12 and the top surface 13S of the storage cell 13 and the variation in the coercive force (Hc) of the free layer is described with reference to FIG. 4. In FIG. 4, a vertical axis shows variation in the coercive force (Hc) as a relative value, and an abscissa axis shows the contact angle α of the second wiring (bit line) 12, respectively.

As shown in FIG. 4, the variation in the coercive force (Hc) is decreased as the contact angle α increases as shown in FIG. 4, and the variation becomes constant when the contact angle α becomes over 45 degrees. Accordingly, it is clear that in order to obtain a stable variation in the coercive force (Hc) characteristic of the free layer, the contact angle α of the second wiring (bit line) 12 to the storage cell 13 has to be over 45 degrees.

The mechanism wherein the variation in the coercive force (Hc) of the free layer deteriorates as the contact angle α decreases is not fully cleared. As a probable reason, if the contact angle α is small, the distance between the top surface 13S of the storage cell 13 and the second wiring (bit line) 12 becomes shorter, so that the storage cell 13 is easily affected the disturbance of the external magnetic filed generated from the second wiring (bit line) 12, and as a result, it is probable that the magnetic domain at the top surface of the storage cell 13 becomes unstable.

Figure 5C:
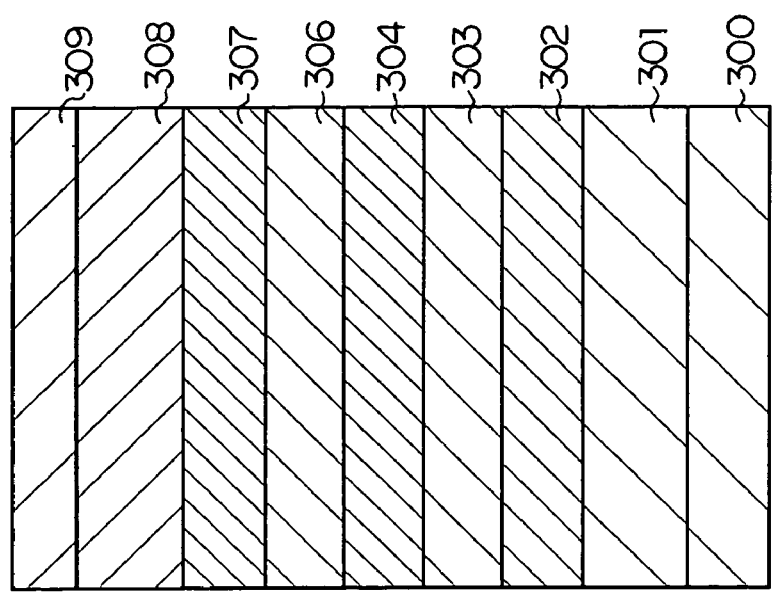
FIGS. 5A, 5B, and 5C are conceptual sectional views showing one of a film structure of the storage cell.
Figure 5B:
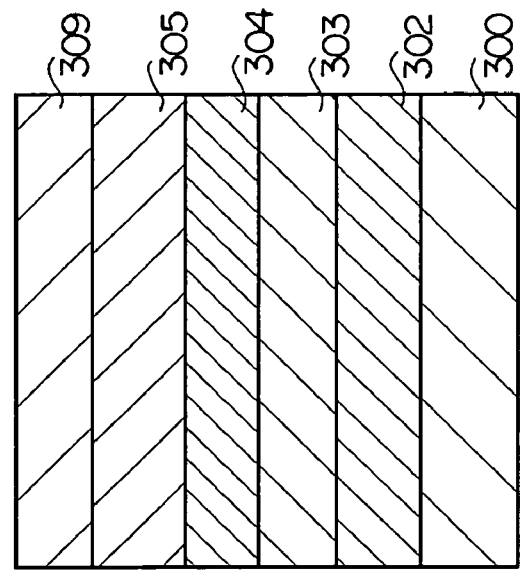
Figure 5A:
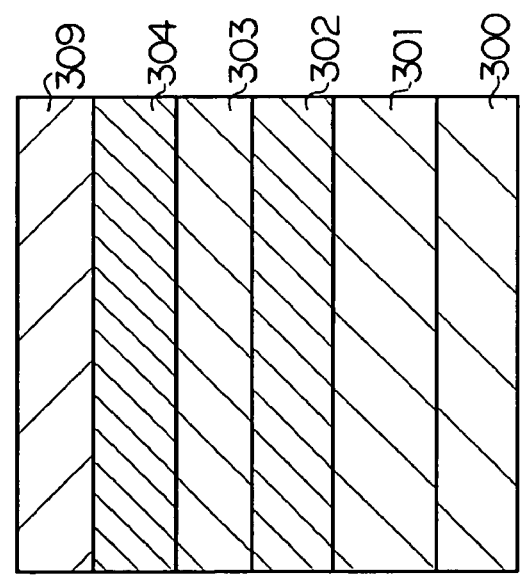

In addition, the above mentioned effects take the same value in a storage cell configured as shown in FIGS. 5A to 5C as will be described below.

Next, a film structure of the typical storage cell 13 is described with reference to a conceptual sectional view depicted in FIG. 5.

As shown FIGS. 5A to 5C, the storage cell 13 is comprised of a so-called Magnetic Tunnel Junction (hereinafter referred to as a MTJ) including an antiferromagnetic layer, a ferromagnetic fixed layer, a non-magnetic spacer layer, and a ferromagnetic free layer. There are stacked structures such as a bottom type (antiferromagnetic layer is provided on bottom), a top type (antiferromagnetic layer is provided on top), a dual type (antiferromagnetic layers are provided on top and bottom) and the like depending on a stacked order of the antiferromagnetic layer, the ferromagnetic fixed layer, the non-magnetic spacer layer, and the ferromagnetic free layer.

The bottom type as shown in FIG. 5A is configured to have a foundation layer (lower electrode) 300, an antiferromagnetic layer 301, a ferromagnetic fixed layer 302, a non-magnetic spacer layer (tunnel insulating layer) 303, a ferromagnetic free layer (storage layer) 304, and a protecting layer (cap layer, and bit line electrode) 309 being stacked in this order from bottom.

The top type (antiferromagnetic layer is provided on top) as shown in FIG. 5B is configured to have a foundation layer (lower electrode) 300, a ferromagnetic fixed layer 302, a non-magnetic spacer layer (tunnel insulating layer) 303, a ferromagnetic free layer (storage layer) 304, an antiferromagnetic layer 305, and a protecting layer (cap layer, and bit line electrode) 309 being stacked in this order from bottom.

The dual type (antiferromagnetic layers are provided on top and bottom) as shown in FIG. 5C is configured to have a foundation layer (lower electrode) 300, an antiferromagnetic layer 301, a ferromagnetic fixed layer 302, a non-magnetic spacer layer (tunnel insulating layer) 303, a ferromagnetic free layer (storage layer) 304, non-magnetic spacer layer (tunnel insulating layer) 306, a ferromagnetic fixed layer 307, an antiferromagnetic layer 308, and a protecting layer (cap layer, and bit line electrode) 309 being stacked in this order from bottom.

Figure 8:
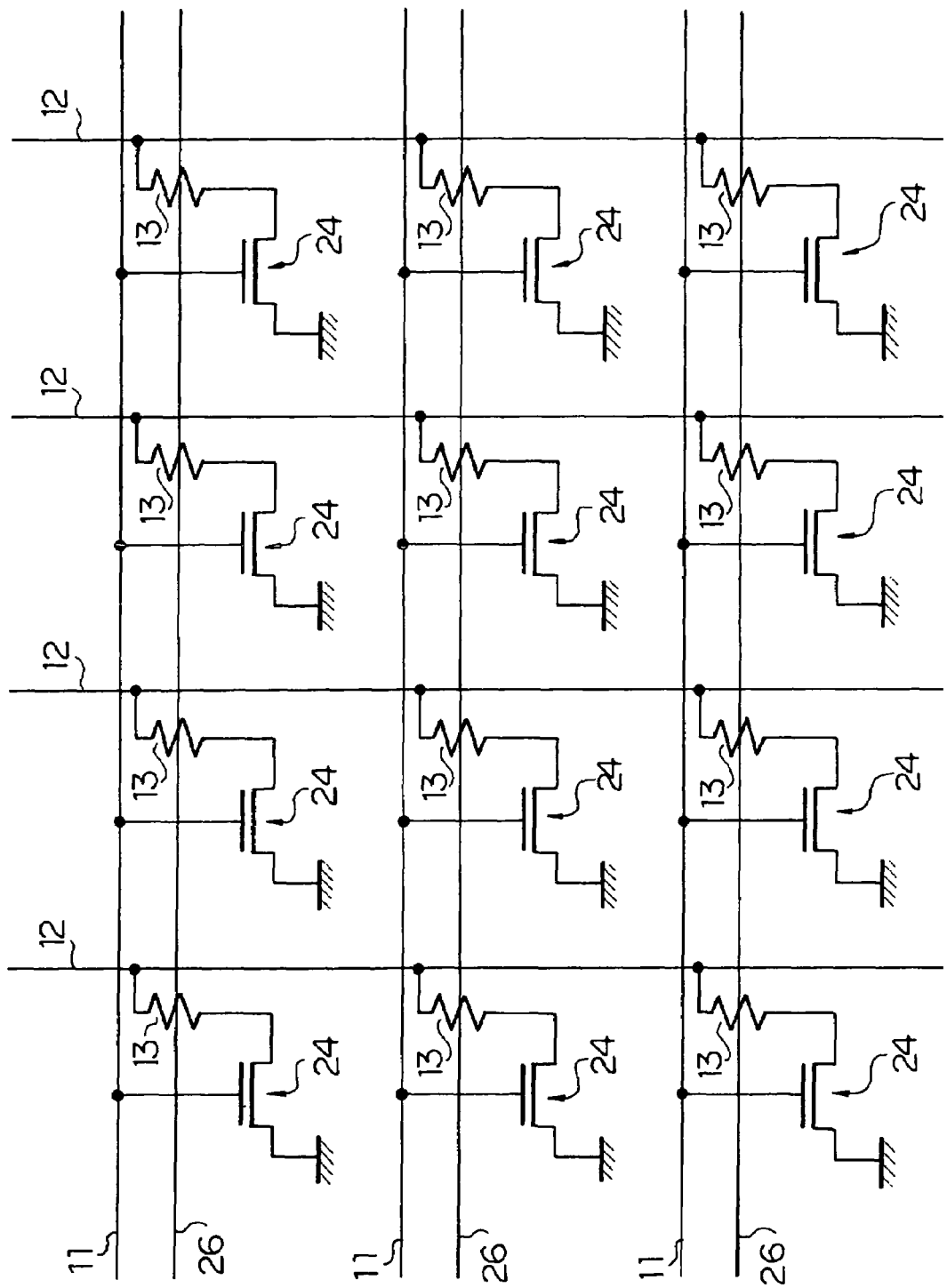
FIG. 8 is a conceptual circuit diagram designating one embodiment of the integrated circuit device including a plurality of magnetic memory devices.

The magnetic memory device of the present invention is able to configure an integrated circuit device by applying the magnetic memory devices to the integrated circuit described in the above mentioned FIG. 8.

Next, one embodiment of a method for manufacturing the magnetic memory device according to the present invention is described with reference to conceptual sectional views in FIGS. 6A to 6G.

As shown in FIG. 6A, after forming a selecting device, a sense line and an insulating film for covering these, and a first wiring (write word line) and an insulating film for covering it by a well-known manufacturing technology for the magnetic memory device, then, a lower electrode (bypass line) 17 is formed. In addition, a film stack 31 for forming a storage cell having a MTJ is formed. Further, as shown in FIG. 6B, a resist film 32 is formed on the above mentioned film stack 31. This resist film 32 is formed to have 300 nm in thickness, for example, by a spin coating method of an organic-based resin. It is preferable that the thickness of the resist film 32 is thicker than that of an insulating film which is formed later.

Then, as shown in FIG. 6C, exposure and development are carried out so as to form a resist pattern 33 which serves as an etching mask in case of forming the storage cell having MTJ by the above mentioned resist film 32. Thereafter, as shown in FIG. 6D, patterning is carried out to the above mentioned film stack 31 using the above mentioned resist pattern 33 by an argon ion milling, for example, to form the storage cell 13 having MTJ.

Then, as shown in FIG. 6E, an insulating film 41 is formed on the above mentioned storage cell 13 while leaving the above mentioned resist pattern 33. This insulating film 41 is formed, for example, by stacking aluminum oxide of 60 nm in thickness using a sputtering method, for example. This sputtering is carried out within a mixed gas atmosphere of oxygen and argon while using an aluminum target. In this case, aluminum oxide is accumulated also on the resist pattern 33. After that, the resist pattern 33 and the insulating film 41 of the aluminum oxide accumulated on this resist pattern 33 are removed by a liftoff method for removing the resist pattern 33 using organic solvent. Thereby as shown in FIG. 6F, the opening 42 is formed at the insulating film 41 on the storage cell 13.

The tilt angle α at the sidewall of the resist pattern 33 and the film-forming condition for the insulating film 41 in case of forming the above mentioned resist pattern 33 are set so that the sidewall 42S of the opening 42 has a tilt angle α=45 degrees or more relative to the above mentioned top surface 13S of the storage cell 13, and is formed to be a forward tapered form. A contact angle α of a second wiring (bit line) which is formed later relative to the top surface of the storage cell 13 is determined by the tilt angle α of the sidewall 42S of the opening 42. This tilt angle α is controlled by changing a shape of the above mentioned resist pattern 33 and the film-forming condition for the insulating film 41 (such as a pressure of the film-forming atmosphere, sputtering power and the like). Further, the shape of the above mentioned resist pattern 33 is able to be changed by a developing condition (blend condition such as density, and developing time). Further, the tilt angle α at the sidewall 42S of the opening 42 depends on an edge shape of the storage cell 13, so that if the edge shape of the storage cell 13 is changed depending on an incident angle of the argon ion upon the ion milling for forming the storage cell 13 as fabrication parameters, it is able to indirectly control the tilt angle α at the sidewall of the opening 42 of the insulating film 41.

Then, as shown in FIG. 6G, a metal film for forming the second wiring (bit line) 12 is formed by a film-forming technology such as a sputtering method and the like so as to bury the above mentioned opening 42. After that, the second wiring (bit line) 12 is formed by patterning the metal film. Accordingly, the contact angle α formed by the sidewall 12S at the second wiring (bit line) 12 portion connected to the top surface 13S of the storage cell 13 and the top surface 13S of the storage cell 13 becomes the same as the tilt angle α at the sidewall 42S of the opening 42, and the contact angle α formed by the sidewall 12S at the second wiring (bit line) 12 portion connected to the top surface 13S of the storage cell 13 and the top surface 13S of the storage cell 13 is 45 degrees or more and forms a forward tapered form.

As described above, according to the magnetic memory device of the present invention, a method for manufacturing the magnetic memory device, and an integrated circuit device including such magnetic memory devices, a partial sidewall portion that is electrically connecting to the storage cell of the second wiring is formed to be a forward tapered form so as to have a contact angle of over 45 degrees relative to the upper surface of the storage cell, so that the distance between the upper surface of the storage cell and the second wiring, the storage cell is hard to receive a disturbance of the external magnetic filed generated from the second wiring, and as a result, the magnetic domain in the upper surface of the storage cell is stabilized. Accordingly, the variation in the coercive force of the magnetic free layer of the storage cell having the MTJ is improved. Thereby, in the integrated circuit device including the magnetic memory devices such as NRAM formed by integrating the present magnetic memory devices, a switching characteristic is improved, and it is able to present a stable magnetic memory device without write error. Further the effect of the present invention depends only on the device structure (contact angle α of the upper electrode), and does not depend on the process and the method for manufacturing described in the embodiment of the present invention.

What is claimed is:

1. A magnetic memory device comprising:
   a first wiring;
   a second wiring intersecting three-dimensionally with said first wiring; and
   a storage cell positioned at an intersecting area of said first wiring and said second wiring for writing/reading information of a magnetic spin, wherein:
   the second wiring overlaps and contacts onto an upper surface of said storage cell, and a sidewall portion of said second wiring electrically connecting to said upper surface of the storage cell has a forward tapered shape having a lower portion overlapping onto the upper surface and having a contact angle relative to the upper surface of said storage cell being 45 degrees or more and an upper portion having an angle relative to the upper surface of said storage cell being less than 45 degrees and greater than 0 degrees.

2. The magnetic memory device as cited in claim 1, wherein:
   said storage cell is a magnetoresistive effect device including a stacked structure comprising an antiferromagnetic layer, a ferromagnetic fixed layer, a non-magnetic spacer layer, and a ferromagnetic free layer.

3. The magnetic memory device as cited in claim 1, wherein:
   said storage cell is the one in which said non-magnetic spacer layer is a tunnel barrier made of an insulator; and said two ferromagnetic layers and said non-magnetic spacer layer located between said two ferromagnetic layers form a magnetic tunnel junction.

4. The magnetic memory device as cited in claim 1, wherein:
   said storage cell is a magnetoresistive effect device including a stacked structure comprising a lower electrode, an antiferromagnetic layer, a ferromagnetic fixed layer, a non-magnetic spacer layer, a ferromagnetic free layer, and a protecting layer in this order from bottom.

5. The magnetic memory device as cited in claim 1, wherein:
   said storage cell is a magnetoresistive effect device including a stacked structure comprising, a lower electrode, a ferromagnetic fixed layer, a non-magnetic spacer layer, a ferromagnetic free layer, an antiferromagnetic layer, and a protecting layer in this order from bottom.

6. The magnetic memory device as cited in claim 1, wherein:
   said storage cell is a magnetoresistive effect device including a stacked structure comprising, a lower electrode, an antiferromagnetic layer, a ferromagnetic fixed layer, a non-magnetic spacer layer, a ferromagnetic free layer, a non-magnetic spacer layer, a ferromagnetic fixed layer, an antiferromagnetic layer, and a protecting layer in this order from bottom.

7. An integrated circuit device of magnetic memory device comprising:

a first wiring;

a second wiring three-dimensionally intersecting with said first wiring; and a storage cell positioned at an intersecting area of said first wiring and said second wiring for writing/reading information of a magnetic spin, wherein:

the second wiring overlaps and contacts onto an upper surface of said storage cell, and a sidewall portion of said second wiring electrically connecting to the upper surface of said storage cell has a forward tapered shape having a lower portion overlapping onto the upper surface and having a contact angle relative to the upper surface of said storage cell being 45 degrees or more and an upper portion having an angle relative to the upper surface of said storage cell being less than 45 degrees and greater than 0 degrees.

8. The integrated circuit device of magnetic memory device as cited in claim 7, wherein:

said storage cell is a magnetoresistive effect device including a stacked structure comprising an antiferromagnetic layer, a ferromagnetic fixed layer, a non-magnetic spacer layer, and a ferromagnetic free layer.

9. The integrated circuit device of magnetic memory device as cited in claim 7, wherein:

said storage cell is the one in which said non-magnetic spacer layer is a tunnel barrier made of an insulator; and said two of ferromagnetic layers and said non-magnetic spacer layer located between said two ferromagnetic layers form a magnetic tunnel junction.

10. The integrated circuit device of magnetic memory device as cited in claim 7, wherein:

said storage cell is a magnetoresistive effect device including a stacked structure comprising, a lower electrode, an antiferromagnetic layer, a ferromagnetic fixed layer, a non-magnetic spacer layer, a ferromagnetic free layer, and a protecting layer in this order from bottom.

11. The integrated circuit device of magnetic memory device as cited in claim 7, wherein:

said storage cell is a magnetoresistive effect device including a stacked structure comprising, a lower electrode, a ferromagnetic fixed layer, a non-magnetic spacer layer, a ferromagnetic free layer, an antiferromagnetic layer, and a protecting layer in this order from bottom.

12. The integrated circuit device of magnetic memory device as cited in claim 7, wherein:

said storage cell is a magnetoresistive effect device including a stacked structure comprising, a lower electrode, an antiferromagnetic layer, a ferromagnetic fixed layer, a non-magnetic spacer layer, a ferromagnetic free layer, a non-magnetic spacer layer, a ferromagnetic fixed layer, an antiferromagnetic layer, and a protecting layer in this order from bottom.

* * * * *